United States Patent
Karmaker et al.

(10) Patent No.: US 10,374,554 B2
(45) Date of Patent: Aug. 6, 2019

(54) DIFFERENTIAL AMPLIFIER WITH COMPLEMENTARY UNIT STRUCTURE

(71) Applicant: QUALCOMM Incorporated, San Diego, CA (US)

(72) Inventors: Rahul Karmaker, San Diego, CA (US); Bin Fan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/855,106

(22) Filed: Dec. 27, 2017

(65) Prior Publication Data
US 2019/0199290 A1    Jun. 27, 2019

(51) Int. Cl.
*H03F 3/45* (2006.01)
*H03F 1/02* (2006.01)
*H03F 3/193* (2006.01)

(52) U.S. Cl.
CPC .......... *H03F 1/0205* (2013.01); *H03F 3/193* (2013.01); *H03F 3/4521* (2013.01); *H03F 2200/36* (2013.01); *H03F 2200/411* (2013.01); *H03F 2200/451* (2013.01); *H03F 2200/456* (2013.01); *H03F 2200/555* (2013.01); *H03F 2203/45022* (2013.01); *H03F 2203/45026* (2013.01); *H03F 2203/45172* (2013.01); *H03F 2203/45188* (2013.01); *H03F 2203/45288* (2013.01)

(58) Field of Classification Search
CPC ............ H03F 3/45; H03F 2003/45008; H03F 2003/45022
USPC .................................................. 330/253, 258
See application file for complete search history.

(56) References Cited

U.S. PATENT DOCUMENTS

| 7,592,870 B2 | 9/2009 | Wang et al. |
| 8,248,161 B2 | 8/2012 | Syed et al. |

(Continued)

FOREIGN PATENT DOCUMENTS

EP          1345320 A2      9/2003

OTHER PUBLICATIONS

Andreani P., et al., "Noise Optimization of an Inductively Degenerated CMOS Low Noise Amplifier", IEEE Transactions on Circuits and Systems—II: Analog and Digital Signal Processing, vol. 48, No. 9, Sep. 2001, pp. 835-841.

(Continued)

*Primary Examiner* — Steven J Mottola
(74) *Attorney, Agent, or Firm* — Patterson & Sheridan, L.L.P.

(57) ABSTRACT

Certain aspects of the present disclosure generally relate to a differential amplifier implemented using a complementary metal-oxide-semiconductor (CMOS) structure. The differential amplifier generally includes a first pair of transistors and a second pair of transistors coupled to the first pair of transistors. The gates of the first pair of transistors and gates of the second pair of transistors may be coupled to respective differential input nodes of the differential amplifier, and drains of the first pair of transistors and drains of the second pair of transistors may be coupled to respective differential output nodes of the differential amplifier. In certain aspects, the differential amplifier may include a biasing transistor having a drain coupled to a source of a transistor of the first pair of transistors and having a gate coupled to a common-mode feedback (CMFB) path of the differential amplifier.

26 Claims, 7 Drawing Sheets

(56) References Cited

U.S. PATENT DOCUMENTS

| | | |
|---|---|---|
| 8,803,612 B1 | 8/2014 | Ooi et al. |
| 9,473,120 B1 | 10/2016 | Yin et al. |
| 9,692,369 B2 | 6/2017 | Ko et al. |
| 2008/0218267 A1 | 9/2008 | Taylor et al. |
| 2012/0049960 A1 | 3/2012 | Hsu |
| 2013/0106513 A1* | 5/2013 | Cyrusian ............ H03F 3/45237 330/254 |

OTHER PUBLICATIONS

International Search Report and Written Opinion—PCT/US2018/067063—ISA/EPO—Mar. 27, 2019.

* cited by examiner

DIFFERENTIAL AMPLIFIER WITH COMPLEMENTARY UNIT STRUCTURE

TECHNICAL FIELD

Certain aspects of the present disclosure generally relate to electronic circuits and, more particularly, to a differential amplifier.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more differential amplifiers to amplify received signals for processing.

SUMMARY

Certain aspects of the present disclosure generally relate to a differential amplifier implemented using a complementary metal-oxide-semiconductor (CMOS) structure.

Certain aspects of the present disclosure provide a differential amplifier. The differential amplifier generally includes a first pair of transistors; a second pair of transistors coupled to the first pair of transistors, wherein gates of the first pair of transistors and gates of the second pair of transistors are coupled to respective differential input nodes of the differential amplifier, wherein drains of the first pair of transistors and drains of the second pair of transistors are coupled to respective differential output nodes of the differential amplifier; and a biasing transistor having a drain coupled to a source of a transistor of the first pair of transistors and having a gate coupled to a common-mode feedback (CMFB) path of the differential amplifier.

Certain aspects of the present disclosure provide a method for signal amplification. The method generally includes comparing a common-mode (CM) voltage of an amplifier having a CMOS structure with a reference voltage, the CMOS structure having a first pair of transistors and a second pair of transistors; amplifying a differential input voltage between a first input voltage at gates of the first pair of transistors and a second input voltage at gates of the second pair of transistors; and providing a bias current to sources of a transistor of the first pair of transistors and a transistor of the second pair of transistors based on the comparison.

Certain aspects of the present disclosure provide an apparatus for signal amplification. The apparatus generally includes means for amplifying a differential input voltage between a first input voltage at gates of a first pair of transistors of a CMOS structure and a second input voltage at gates of a second pair of transistors of the CMOS structure; means for comparing a CM voltage of the means for amplifying with a reference voltage; and means for providing a biasing current to sources of a transistor of the first pair of transistors and a transistor of the second pair of transistors based on the comparison.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
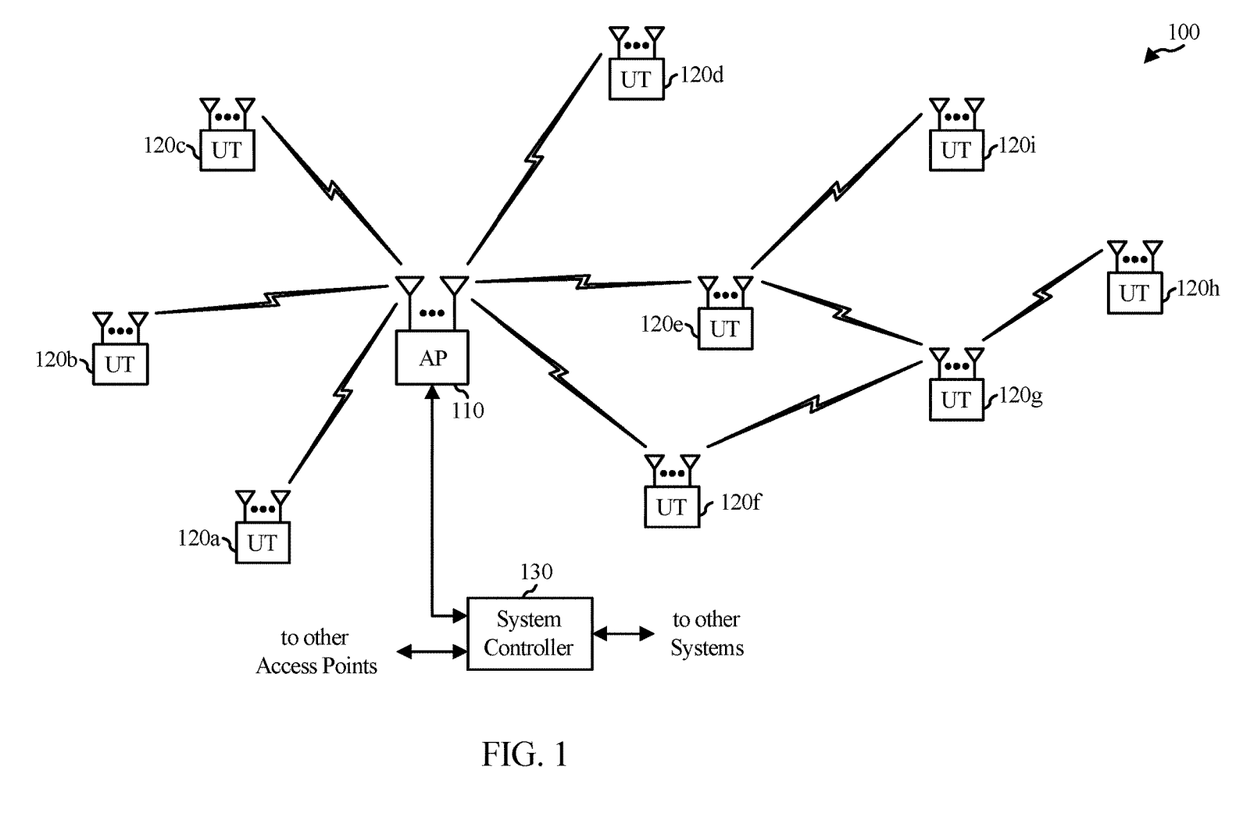
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include at least one differential amplifier, as described in more detail herein.

Figure 2:
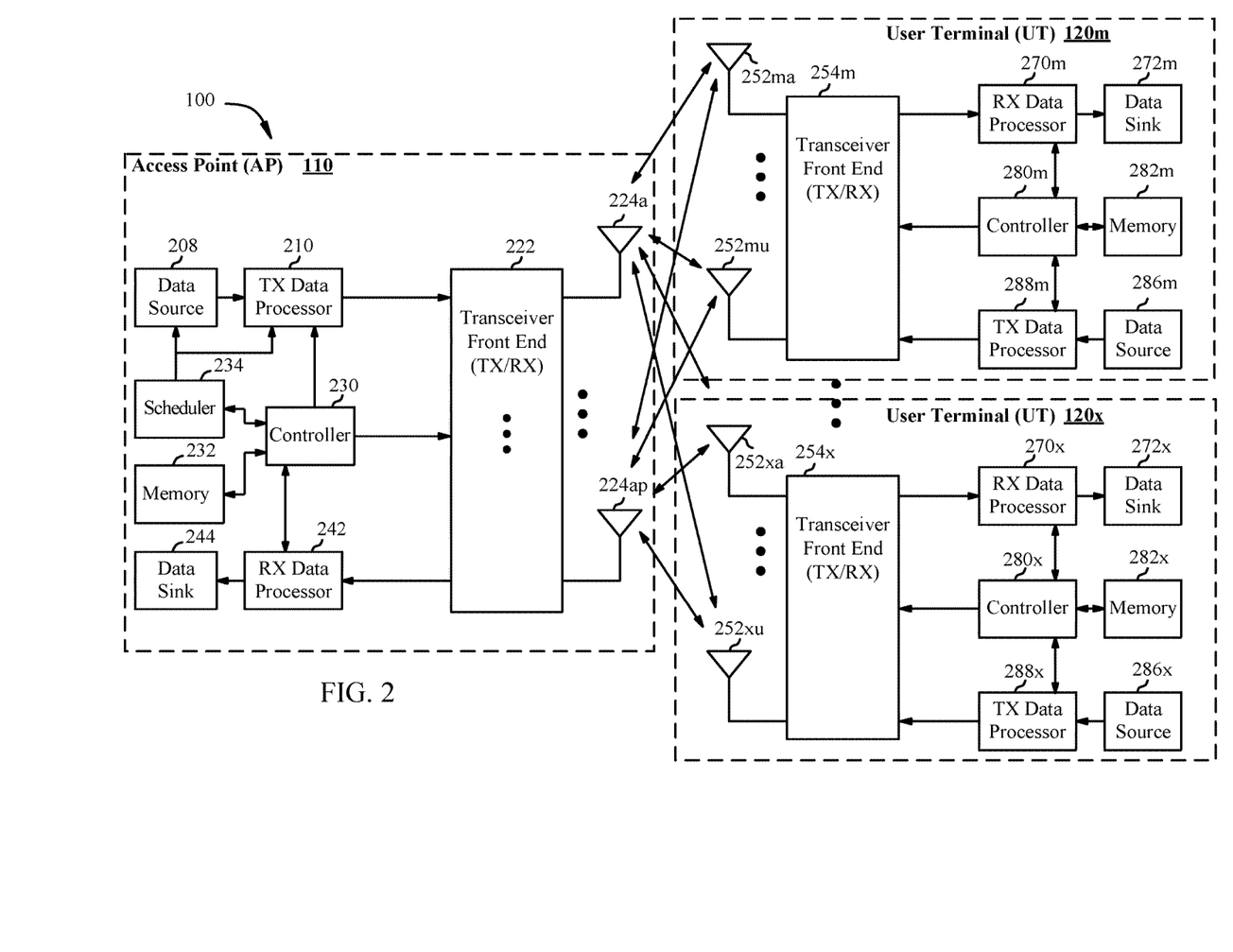
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects, the transceiver front end (TX/RX) 222 of access point 110 and/or transceiver front end 254 of user terminal 120 may include a differential amplifier, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
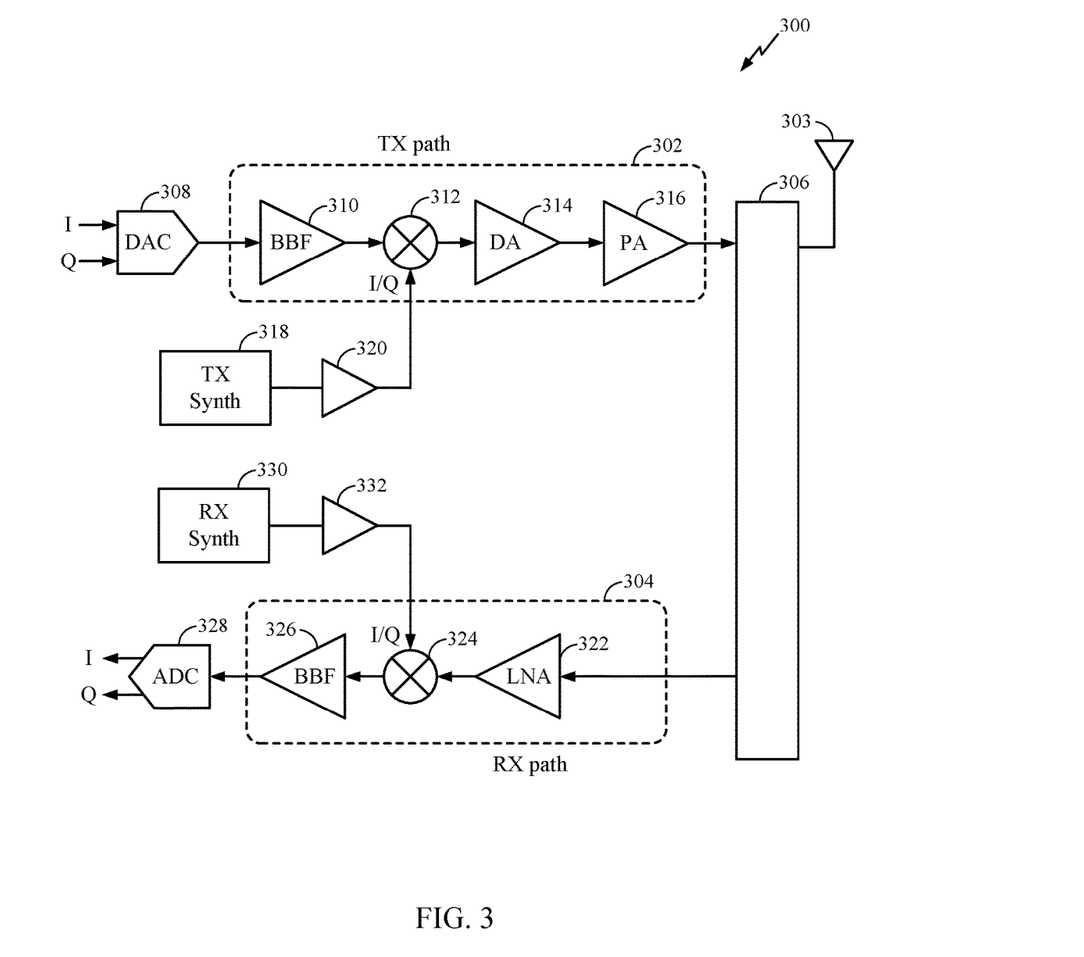
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. In some aspects, the LNA 322 may be implemented as a differential amplifier, as described in more detail herein. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 provide a wireless communication system as an example application in which certain aspects of the present disclosure may be implemented to facilitate understanding, certain aspects provided herein can be applied to amplify signals in any of various other suitable systems. For example, the amplification circuit described herein can be used to amplify signals in audio amplifiers or voltage meters, to name a few.

Example Differential Amplifier with Complementary Unit Structure

Low noise amplifiers (LNAs) or transimpedance amplifiers (TIAs) implemented to operate with high bandwidth (BW), low thermal noise, and high linearity, may use a complementary metal-oxide semiconductor (CMOS) structure implemented using p-channel metal-oxide semiconductor (PMOS) and n-channel metal-oxide semiconductor (NMOS) transistors. Certain aspects of the present disclosure are generally directed to a biasing technique for the CMOS structure that improves the input third-order intercept point (IIP3) and noise figure (NF) performance of the amplifier while also reducing the physical size of the amplifier as compared to LNAs or TIAs implemented using a conventional biasing technique.

Figure 4:
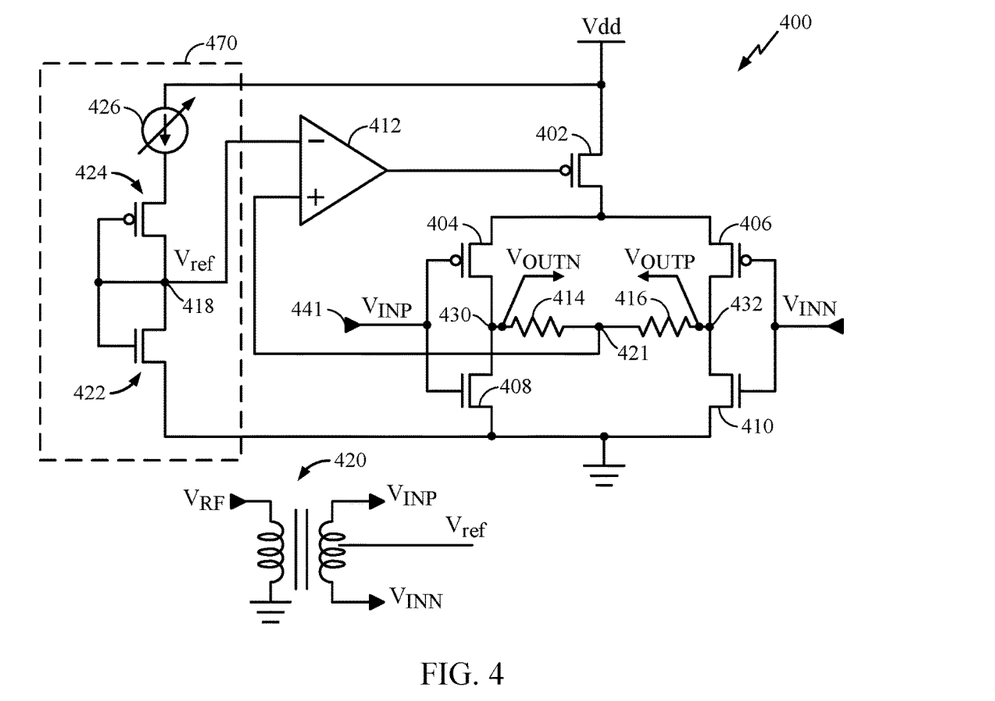
FIG. 4 illustrates an example amplifier having a head switch coupled to a common-mode feedback (CMFB) path, in accordance with certain aspects of the present disclosure.

FIG. 4 illustrates an example amplifier 400 having a head switch (e.g., a biasing transistor 402) coupled to a common-mode feedback (CMFB) path, in accordance with certain aspects of the present disclosure. The CMFB path is coupled between a common-mode (CM) node 421 and the gate of the biasing transistor 402. The amplifier 400 includes a CMOS structure having transistors 404 and 406 (e.g., PMOS transistors) having sources coupled to a drain of the biasing transistor 402 and transistors 408 and 410 (e.g., NMOS transistors) having sources coupled to a reference potential node (e.g., electric ground). The gates of transistors 404 and 408 are coupled to a positive input signal $V_{INP}$ of a differential input signal, and the gates of transistors 406 and 410 are coupled to a negative input signal $V_{INN}$ of the differential input signal.

In certain aspects, the transistors 404 and 406 may be replicas of each other. Therefore, with regards to a common-mode component of the input signal, the transistors 404 and 406 may have the same gate-to-source voltage $V_{GSP}$. Moreover, the transistors 408 and 410 may be replicas of each other, such that transistors 408 and 410, with regards to common-mode component of the input signal, have the same $V_{GSN}$. Since the gates of transistors 408 and 404 are connected, and the gates of transistors 410 and 406 are connected, the voltage at the drain of the biasing transistor 402 may be equal to $V_{GSP}+V_{GSN}$.

In certain aspects, a source of the biasing transistor 402 may be coupled to a voltage rail Vdd, and a gate of the biasing transistor 402 may be coupled to an output of an amplifier 412 (e.g., a feedback amplifier) of the CMFB path. The positive input terminal of the amplifier 412 may be coupled to the CM node 421 of the amplifier 400 between resistive devices 414 and 416. For example, the resistive devices 414 and 416 may have the same resistance, such that the CM voltage ($V_{CM}$) at the CM node 421 is:

$$\frac{VOUTN + VOUTP}{2}$$

where $V_{OUTN}$ and $V_{OUTP}$ are the negative and positive differential output voltages of the amplifier 400, respectively. With respect to the operation of the amplifier in response to a CM signal, $V_{OUTN}$ and $V_{OUTP}$ may be about equal such that $V_{CM}$ is about equal to $V_{OUTN}$ and is about equal to $V_{OUTP}$.

The negative input terminal of the amplifier 412 may be coupled to a node 418 (e.g., a reference voltage node) for providing a reference voltage $V_{ref}$ representing a desired CM voltage of the amplifier 400. For certain aspects, the node 418 may also be coupled to a center tap of a secondary winding of a transformer 420. The transformer 420 may be configured to receive a single-ended RF signal ($V_{RF}$), for example, at the primary winding of the transformer 420 and provide differential input voltages $V_{INN}$ and $V_{INP}$ at the terminals of the secondary winding of the transformer 420. The differential input voltages $V_{INN}$ and $V_{INP}$ are then amplified by the amplifier 400 to provide the differential output voltages $V_{OUTN}$ and $V_{OUTP}$.

As illustrated, node 418 may be coupled between two diode devices. For example, the node 418 may be coupled between two diode-connected transistors 422 and 424 of a reference voltage generation circuit 470, which are biased using a current source 426, to set the reference voltage $V_{ref}$. In certain aspects, the transistor 422 (an NMOS transistor as shown) may be a replica of transistors 408 and 410, and thus, the gate-to-source voltage $V_{GSN}$ of the transistors 422, 408, and 410 may be the same under the same conditions such that $V_{ref}$ is equal to $V_{GSN}$ of transistors 408 and 410.

The amplifier 412 compares the CM voltage $V_{CM}$ at the CM node 421 with the reference voltage $V_{ref}$ (e.g., $V_{GSN}$), and drives the gate of the biasing transistor 402 in an attempt to equalize $V_{CM}$ at the CM node 421 with the reference voltage $V_{ref}$. As presented above, with respect to a CM signal, $V_{OUTP}$ and $V_{OUTN}$ may be equal and no CM current may flow across resistive devices 414 and 416. Therefore, there may be no voltage drop across the resistive devices 414 and 416, and as such, $V_{CM}$ may be equal to $V_{OUTP}$, which may be equal to $V_{OUTN}$. Thus, with respect to a CM signal, the CMFB path may effectively set the drain voltages of transistors 408 and 410 to be equal to $V_{GSN}$, such that the pair of transistors 408 and 410 behave similar to diode-connected transistors having equal drain and gate voltages, and thus, operate in saturation across process, voltage, and temperature (PVT) variations.

In certain aspects, the headroom of the head switch (e.g., biasing transistor 402) may be reduced by increasing the size of the biasing transistor 402. In certain aspects, the amplifier 400 may be directly coupled to the secondary winding of the transformer 420, or to an output of a transconductance stage, which may be coupled between the transformer 420 and the amplifier 400.

The amplifier configuration described with respect to FIG. 4 allows for the transistors 404 and 408 to be controlled by a common input voltage $V_{INP}$, and transistors 406 and 410 to be controlled by a common input voltage $V_{INN}$, without the use of alternating-current (AC) coupling capacitors. Thus, the amplifier 400 may have lower power consumption as compared to conventional amplifiers that separately bias the PMOS and NMOS transistors and use AC coupling capacitors, improving the NF of the amplifier 400.

Figure 5:
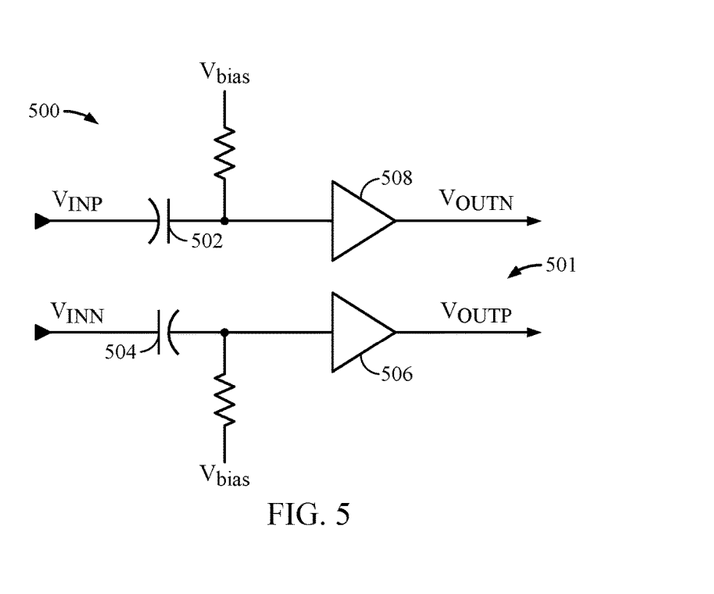
FIG. 5 illustrates example auxiliary paths coupled between respective inputs and outputs of the amplifier of FIG. 4, in accordance with certain aspects of the present disclosure.

FIG. 5 illustrates example auxiliary paths 500 and 501 coupled between respective inputs and outputs of the amplifier 400, in accordance with certain aspects of the present disclosure. Each of the auxiliary paths 500 and 501 may include a transconductance amplifier 506 and 508, biased in the subthreshold region to allow for cancellation of distortion caused by non-linearity associated with the amplifier 400. As illustrated, the transconductance amplifiers 506 and 508 may receive input voltages $V_{INM}$ and $V_{INP}$ through AC coupling capacitors 504 and 502, respectively. The transconductance amplifiers 506 and 508 provide current to output nodes 430 and 432 respectively to improve the non-linearity of the amplifier 400. In other words, the CMOS structure transistors biased in the saturation region may have non-linearity associated with a positive third-order transconductance $G_{M3}$, which is cancelled (or at least reduced) by the negative $G_{M3}$ of the auxiliary paths 500 and 501 biased in the subthreshold region.

While two auxiliary paths 500 and 501 are illustrated in FIG. 5, only a single auxiliary path may be implemented for distortion cancellation in other aspects. For example, only the auxiliary path 500 may be included in the amplifier, in this case coupled between the input node 441 and the output node 430. In certain aspects, the transconductance amplifiers 506 and 508 may be implemented as NMOS transconductance amplifiers (e.g., using an NMOS transistor) biased in the subthreshold region. The transconductance amplifiers 506 and 508 may be biased using biasing voltages $V_{bias}$, as illustrated.

Figure 6:
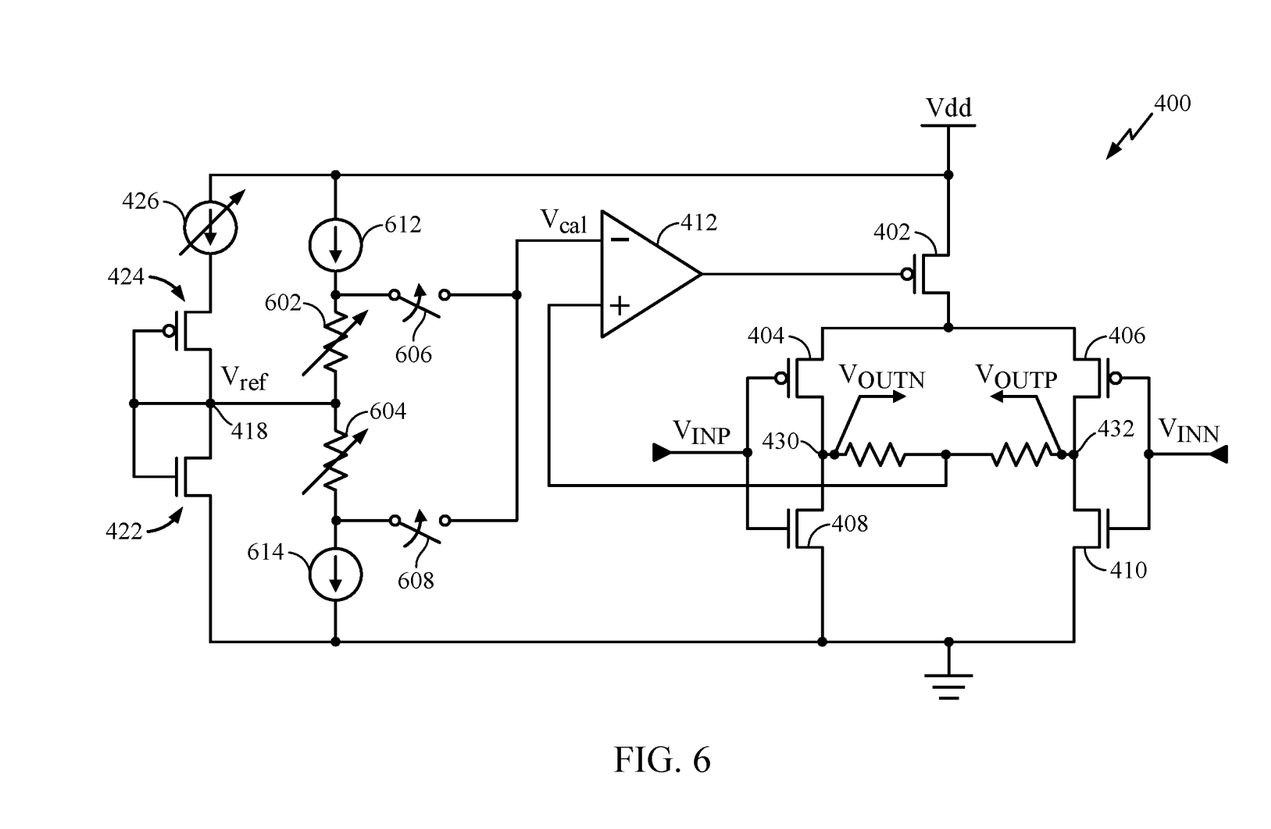
FIG. 6 illustrates an example amplifier implemented with a calibration circuit, in accordance with certain aspects of the present disclosure.

FIG. 6 illustrates the example amplifier 400 implemented to allow for calibration of the drain voltages of transistors 404, 406, 408, and 410, in accordance with certain aspects of the present disclosure. Non-linearity at output nodes 430 and 432 may be dependent on the drain-to-source ($V_{DS}$) voltage of the transistors 408 and 410. Thus, by allowing for calibration of the drain voltages of the CMOS structure, the non-linearity associated with the $V_{DS}$ of the CMOS structure transistors can be improved by adjusting the drain voltage of the transistors.

To allow for calibration of the drain voltages, the node 418 may be coupled to variable resistive devices 602 and 604, each of the variable resistive devices 602 and 604 being coupled to a respective current source 612 or 614 for providing a biasing current. Supplied to a node coupled to the negative input terminal of the amplifier 412, a calibrated voltage $V_{cal}$ may be generated having a higher voltage than $V_{ref}$ by closing switch 606 (and opening switch 608). In this case, the voltage $V_{cal}$ may be set by adjusting the resistance of the variable resistive device 602. The calibrated voltage $V_{cal}$ may also be generated having a lower voltage than $V_{ref}$ by closing switch 608 (and opening switch 606), and setting the resistance of the variable resistive device 604. In some cases, the voltage $V_{cal}$ may be set to the same voltage as $V_{ref}$, if no calibration is desired. For example, the variable resistive device 602 (or variable resistive device 604) may be configured with zero resistance (e.g., shorted), thereby coupling the node 418 to the negative terminal of the amplifier 412 by closing switch 606 (or switch 608).

Figure 7:
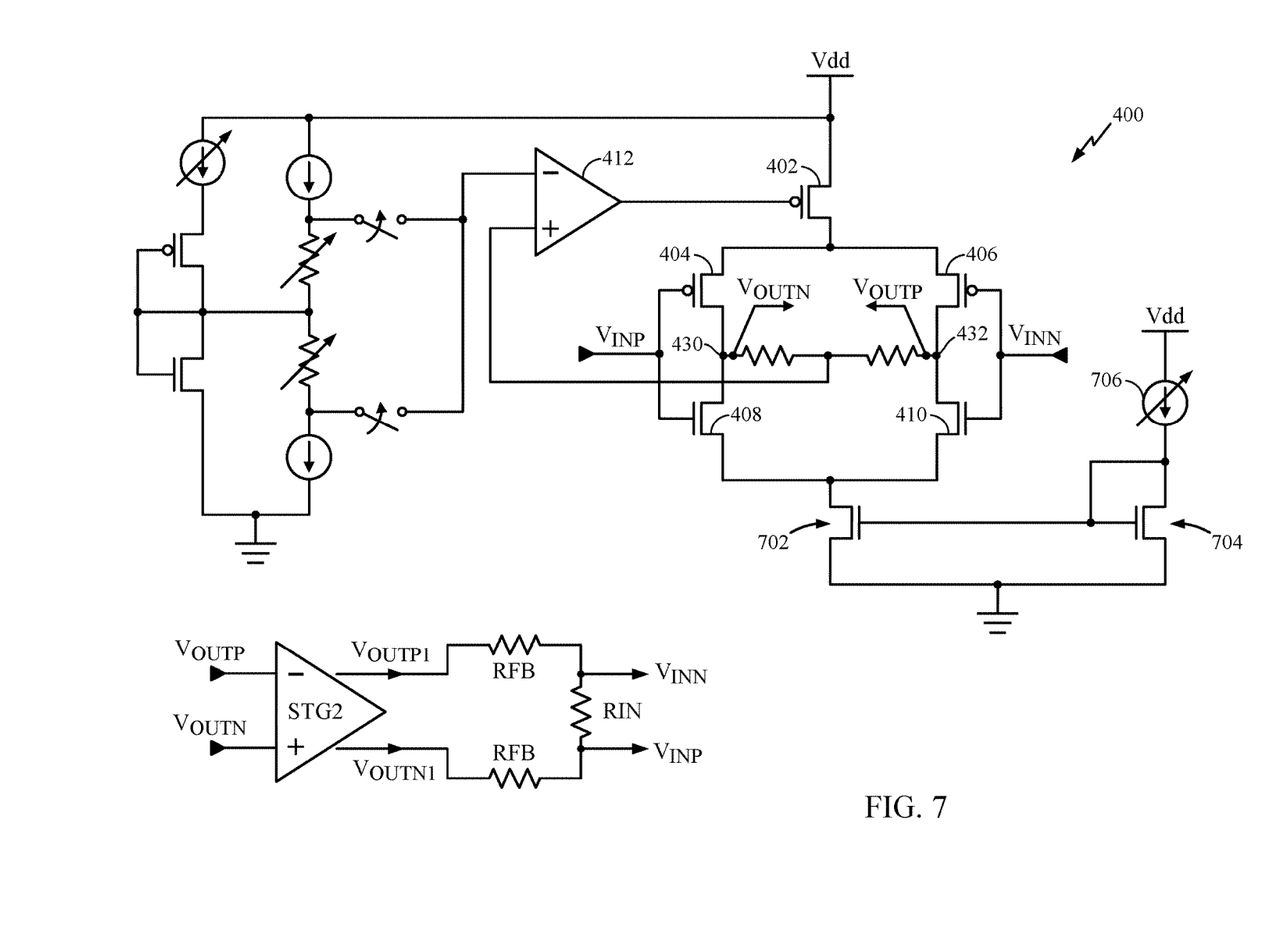
FIG. 7 illustrates an example amplifier implemented as part of a two-stage feedback operational transconductance amplifier (OTA), in accordance with certain aspects of the present disclosure.

FIG. 7 illustrates the example amplifier 400 implemented as part of a two-stage feedback operational transconductance amplifier (OTA), in accordance with certain aspects of the present disclosure. For example, the amplifier 400 may be a first amplification stage of multiple stages, and the output nodes 430 and 432 of the amplifier 400 may be coupled to inputs of a second amplification stage (STG2), as illustrated. The output of the second amplification stage STG2 may be coupled to the inputs of the amplifier 400 through a feedback path, as illustrated. The feedback path may have feedback resistances (RFB) and/or an input resistance (RIN) coupled to the amplifier 400, for example, as shown in FIG. 7. Thus, in addition to an input RF signal (e.g., received via the transformer 420 of FIG. 4), the input signals $V_{INP}$ and $V_{INN}$ are generated based on output signals $V_{OUTP1}$ and $V_{OUTN1}$ generated by the second amplification stage (STG2).

In order for the amplifier 400 to be implemented as a first stage of a multi-stage amplifier, a transistor 702 (e.g., a current source) may have a drain coupled to the sources of transistors 408 and 410, where the transistor 702 is one branch of a current mirror. For example, the gate and source of transistor 702 may be coupled to the gate and source of transistor 704, respectively. The gate and drain of transistor 704 may be coupled together and to a (variable) biasing current source 706, as illustrated, to set the amount of tail current sunk from the sources of transistors 408 and 410 by the transistor 702. By coupling the input of the amplifier 400 to the feedback path, as illustrated, the input CM of amplifier 400 may be the same as the output CM of the amplifier 400. Thus, the transistor 702 is included to allow for control of the amplifier current in a manner that is stable across PVT variations.

Figure 8:
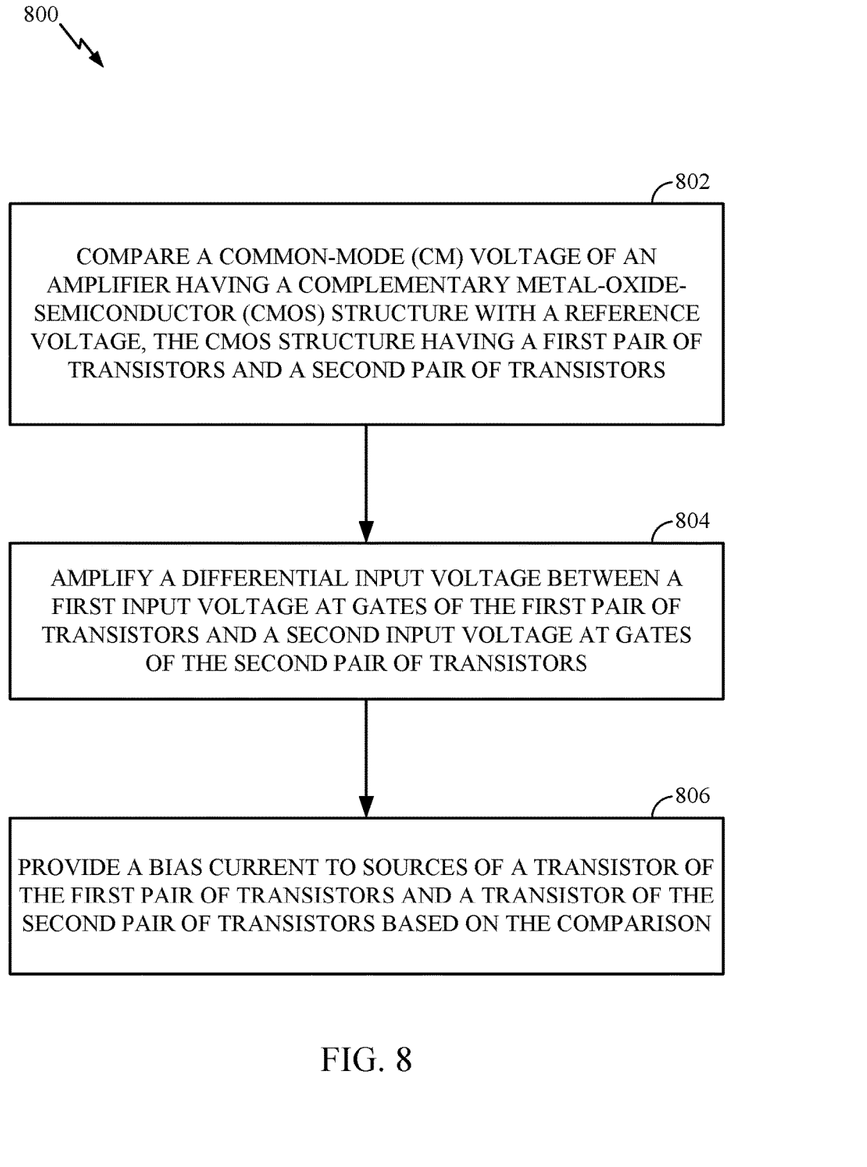
FIG. 8 is a flow diagram of example operations for signal amplification, in accordance with certain aspects of the present disclosure.

FIG. 8 is a flow diagram of example operations 800 for signal amplification, in accordance with certain aspects of the present disclosure. The operations 800 may be performed by a circuit, such as the amplifier 400 of FIGS. 4-7.

The operations 800 may begin, at block 802, by comparing a CM voltage of an amplifier (e.g., the amplifier 400) having a CMOS structure with a reference voltage (e.g., reference voltage $V_{ref}$ or calibrated voltage $V_{cal}$). In certain aspects, the CMOS structure may have a first pair of transistors (e.g., transistors 404 and 408) and a second pair of transistors (e.g., transistors 406 and 410). At block 804, the operations 800 continue by amplifying a differential input voltage between a first input voltage (e.g., $V_{INP}$) at gates of the first pair of transistors and a second input voltage (e.g., $V_{INM}$) at gates of the second pair of transistors. At block 806, a bias current is provided to sources of a transistor (e.g., transistor 404) of the first pair of transistors and a transistor (e.g., transistor 406) of the second pair of transistors based on the comparison at block 802.

In certain aspects, the operations 800 may also include converting (e.g., via the auxiliary path 500) the first input voltage to a first current and providing the first current to drains of the first pair of transistors. In certain aspects, the operations 800 may also include converting (e.g., via the auxiliary path 501) the second input voltage to a second current and providing the second current to drains of the second pair of transistors.

In certain aspects, the operations 800 may also include generating the reference voltage such that the reference voltage is equal to a gate-to-source voltage of a replica transistor (e.g., transistor 412) being a replica of another transistor of the second pair of transistors. For example, the reference voltage may be generated such that the reference voltage is equal to the $V_{GS}$ of the other transistor in the second pair of transistors. In some cases, the operations 800 may also include converting a single-ended RF input voltage to the differential input voltage via a transformer (e.g., transformer 420) and providing the reference voltage to a center tap of a winding of the transformer.

In certain aspects, the operation 800 may also include generating another reference voltage (e.g., the reference voltage $V_{ref}$) such that the other reference voltage is equal to a gate-to-source ($V_{GS}$) of a replica transistor (e.g., transistor 412) being a replica of another transistor (e.g., transistor 410) of the second pair of transistors, and generating the reference voltage (e.g., reference voltage $V_{cal}$) by adjusting the other reference voltage. In this case, the other reference voltage may be adjusted to reduce non-linearity associated with the amplification of the differential input voltage.

In certain aspects, the operations 800 may further include sinking currents from sources of another transistor (e.g., transistor 408) of the first pair of transistors and another transistor (e.g., transistor 410) of the second pair of transistors. In this case, the operations 800 may further include generating feedback signals based on a differential output signal, the differential output signal being generated based on the amplification of the differential input voltage, amplifying the feedback signal to generate an amplified feedback signal, and generating the differential input voltage based on the amplified feedback.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering. For example, means for amplifying may include an amplifier, such as the amplifier 400. Means for comparing may include an amplifier such as the amplifier 412. Means for providing a biasing current may include a transistor such as the biasing transistor 402. Means for generating a reference voltage (or another reference voltage) may include a circuit such as the reference voltage generation circuit 470.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A differential amplifier comprising:
    a first pair of transistors;
    a second pair of transistors coupled to the first pair of transistors, wherein gates of the first pair of transistors and gates of the second pair of transistors are coupled to respective differential input nodes of the differential amplifier, wherein drains of the first pair of transistors and drains of the second pair of transistors are coupled to respective differential output nodes of the differential amplifier; and
    a biasing transistor having a drain coupled to a source of a transistor of the first pair of transistors and having a gate coupled to a common-mode feedback path of the differential amplifier, the common-mode feedback path comprising a feedback amplifier having a first input coupled to a common-mode node of the differential amplifier, having a second input coupled to a reference voltage node, and having an output coupled to the gate of the biasing transistor wherein the reference voltage node is coupled to a replica transistor that is a replica of at least one of a transistor of the first pair of transistors or a transistor of the second pair of transistors, and wherein the replica transistor is configured to generate a reference voltage at the reference voltage node equal to a gate to source voltage of the replica transistor.

2. The differential amplifier of claim 1, further comprising:
    a first transconductance amplifier having an input coupled to a positive input node of the differential input nodes through a first alternating-current coupling capacitor, and having an output coupled to a negative output node of the differential output nodes.

3. The differential amplifier of claim 2, further comprising:
    a second transconductance amplifier having an input coupled to a negative input node of the differential input nodes through a second alternating-current coupling capacitor, and having an output coupled to a positive output node of the differential output nodes.

4. The differential amplifier of claim 1, wherein the drain of the biasing transistor is coupled to a source of a transistor of the second pair of transistors.

5. The differential amplifier of claim 1, wherein a gate and a drain of the replica transistor are coupled together.

6. The differential amplifier of claim 1, wherein the reference voltage node is coupled to a center tap of a secondary winding of a transformer, wherein each of a first terminal and a second terminal of the secondary winding is coupled to a respective input node of the differential input nodes, and wherein a primary winding of the transformer is coupled to a radio-frequency input node.

7. The differential amplifier of claim 1, further comprising:
    a first diode device coupled between the reference voltage node and a reference potential node, the reference potential node being coupled to a source of another transistor of the first pair of transistors and a source of another transistor of the second pair of transistors;
    a current source; and
    a second diode device coupled between the current source and the reference voltage node.

8. The differential amplifier of claim 7, wherein:
    the first diode device comprises an n-channel metal-oxide semiconductor transistor having a gate coupled to a drain of the n-channel metal-oxide semiconductor transistor; and
    the second diode device comprises an p-channel metal-oxide semiconductor transistor having a gate coupled to a drain of the p-channel metal-oxide semiconductor transistor.

9. The differential amplifier of claim 1, further comprising a first resistive device and a second resistive device coupled between the differential output nodes, wherein the common-mode node comprises a node between the first resistive device and the second resistive device.

10. The differential amplifier of claim 1, further comprising:
    a first switch having a first terminal coupled to a second input of the feedback amplifier, and having a second terminal coupled to a reference voltage node through a first variable resistive device; and
    a first current source coupled to the first variable resistive device.

11. The differential amplifier of claim 10, further comprising:
    a second switch having a first terminal coupled to the second input of the feedback amplifier, and having a second terminal coupled to the reference voltage node through a second variable resistive device; and
    a second current source coupled to the second variable resistive device.

12. The differential amplifier of claim 1, further comprising:
    a current source coupled to sources of another transistor of the first pair of transistors and a transistor of the second pair of transistors.

13. A multi-stage amplifier comprising:
    a first amplification stage, wherein the differential amplifier of claim 12 is the first amplification stage;
    a second amplification stage; and
    feedback paths coupled between differential output nodes of the second amplification stage and the differential input nodes of the first amplification stage.

14. The differential amplifier of claim 1, further comprising a current mirror having:
    a first transistor having a drain coupled to sources of another transistor of the first pair of transistors and a transistor of the second pair of transistors; and
    a second transistor having a gate coupled to:
        a gate of the first transistor;
        a drain of the second transistor; and
        a current source.

15. The differential amplifier of claim 1, wherein:
the first pair of transistors comprises a first p-channel metal-oxide semiconductor transistor and a first n-channel metal-oxide semiconductor transistor having a drain coupled to a drain of the first p-channel metal-oxide semiconductor transistor; and
the second pair of transistors comprises a second p-channel metal-oxide semiconductor transistor and a second n-channel metal-oxide semiconductor transistor having a drain coupled to a drain of the second p-channel metal-oxide semiconductor transistor.

16. A method for signal amplification, comprising:
comparing a common-mode voltage of an amplifier having a complementary metal-oxide-semiconductor structure with a reference voltage, the complementary metal-oxide-semiconductor structure having a first pair of transistors and a second pair of transistors;
amplifying a differential input voltage between a first input voltage at gates of the first pair of transistors and a second input voltage at gates of the second pair of transistors;
providing a bias current to sources of a transistor of the first pair of transistors and a transistor of the second pair of transistors based on the comparison; and
generating the reference voltage such that the reference voltage is equal to a gate-to-source voltage of a replica transistor being a replica of another transistor of the second pair of transistors.

17. The method of claim 16, further comprising:
converting the first input voltage to a first current; and
providing the first current to drains of the first pair of transistors.

18. The method of claim 17, further comprising:
converting the second input voltage to a second current; and
providing the second current to drains of the second pair of transistors.

19. The method of claim 16, further comprising:
converting a single-ended radio-frequency input voltage to the differential input voltage via a transformer; and
providing the reference voltage to a center tap of a winding of the transformer.

20. The method of claim 16, further comprising:
generating another reference voltage such that the other reference voltage is equal to a gate-to-source voltage of a replica transistor being a replica of another transistor of the second pair of transistors; and
generating the reference voltage by adjusting the other reference voltage.

21. The method of claim 20, wherein the other reference voltage is adjusted to reduce non-linearity associated with the amplification of the differential input voltage.

22. The method of claim 16, further comprising:
sinking currents from sources of another transistor of the first pair of transistors and another transistor of the second pair of transistors.

23. The method of claim 22, further comprising:
generating feedback signals based on a differential output signal, the differential output signal being generated based on the amplification of the differential input voltage;
amplifying the feedback signal to generate an amplified feedback signal; and
generating the differential input voltage based on the amplified feedback signal.

24. An apparatus for signal amplification, comprising:
means for amplifying a differential input voltage between a first input voltage at gates of a first pair of transistors of a complementary metal-oxide-semiconductor structure and a second input voltage at gates of a second pair of transistors of the complementary metal-oxide-semiconductor structure;
means for comparing a common-mode voltage of the means for amplifying with a reference voltage;
means for providing a bias current to sources of a transistor of the first pair of transistors and a transistor of the second pair of transistors based on the comparison; and
means for generating the reference voltage such that the reference voltage is equal to a gate-to-source voltage of a replica transistor being a replica of another transistor of the second pair of transistors.

25. The apparatus of claim 24, wherein the means for comparing and the means for providing are configured to provide the bias current such that the gate-to-source voltage of the other transistor of the second pair of transistors is equal to the reference voltage.

26. The apparatus of claim 24, further comprising:
means for generating another reference voltage such that the other reference voltage is equal to a gate-to-source voltage of a replica transistor being a replica of another transistor of the second pair of transistors; and
means for generating the reference voltage by adjusting the other reference voltage.

* * * * *